United States Patent
Park et al.

(10) Patent No.: US 7,655,940 B2
(45) Date of Patent: Feb. 2, 2010

(54) STORAGE NODE INCLUDING DIFFUSION BARRIER LAYER, PHASE CHANGE MEMORY DEVICE HAVING THE SAME AND METHODS OF MANUFACTURING THE SAME

(75) Inventors: Jong-bong Park, Suwon-si (KR); Woong-chul Shin, Suwon-si (KR); Jang-ho Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 71 days.

(21) Appl. No.: 11/984,763

(22) Filed: Nov. 21, 2007

(65) Prior Publication Data
US 2008/0128677 A1 Jun. 5, 2008

(30) Foreign Application Priority Data
Nov. 30, 2006 (KR) .................. 10-2006-0120104

(51) Int. Cl.
*H01L 29/02* (2006.01)

(52) U.S. Cl. ............ 257/2; 257/3; 257/4; 257/E31.092; 365/100; 365/163; 438/3; 438/238

(58) Field of Classification Search ................. 257/1–5, 257/295, 296, 734, E31.029; 365/100, 103, 365/113, 130, 148, 163, 185.03, 185.2; 438/3, 438/238, 239, 386, 399, 900
See application file for complete search history.

(56) References Cited

U.S. PATENT DOCUMENTS

2007/0284622 A1* 12/2007 Ryoo et al. .................. 257/213

* cited by examiner

*Primary Examiner*—Evan Pert
*Assistant Examiner*—Scott R Wilson
(74) *Attorney, Agent, or Firm*—Harness, Dickey & Pierce, P.L.C.

(57) ABSTRACT

A phase change memory device and a method of manufacturing the phase change memory device are provided. The phase change memory device may include a switching element and a storage node connected to the switching element, wherein the storage node includes a bottom electrode and a top electrode, a phase change layer interposed between the bottom electrode and the top electrode, and a titanium-tellurium (Ti—Te)-based diffusion barrier layer interposed between the top electrode and the phase change layer. The Ti—Te based diffusion barrier layer may be a $Ti_xTe_{1-x}$ layer wherein x may be greater than 0 and less than 0.5.

19 Claims, 7 Drawing Sheets

STORAGE NODE INCLUDING DIFFUSION BARRIER LAYER, PHASE CHANGE MEMORY DEVICE HAVING THE SAME AND METHODS OF MANUFACTURING THE SAME

PRIORITY STATEMENT

This application claims the benefit of priority under 35 U.S.C. §119 from Korean Patent Application No. 10-2006-0120104, filed on Nov. 30, 2006, in the Korean Intellectual Property Office, the content of which is incorporated herein by reference in its entirety.

BACKGROUND

1. Field

Example embodiments relate to a storage node including a diffusion barrier layer, a phase change memory device having the same and methods of manufacturing the same. Other example embodiments to storage node that suppresses titanium (Ti) diffusion and a method of manufacturing the phase change memory device.

2. Description of the Related Art

In general, phase change memory devices (e.g., phase change random access memories) include a storage node with a phase change layer and a transistor connected to the storage node. The phase change layer changes from a crystalline state to an amorphous state, or vise versa, according to the voltage applied thereto. If the applied voltage is a set voltage, the phase change layer changes from the amorphous state to the crystalline state. If the applied voltage is a reset voltage, the phase change layer changes from the crystalline state to the amorphous state.

One of the crystalline state and the amorphous state of the phase change layer corresponds to data 1 while the other corresponds to data 0. The resistance of the phase change layer, if the phase change layer is in the crystalline state, may be smaller than that the resistance of the phase change layer in the amorphous state. The current measured when the phase change layer is in the crystalline state is larger than that when the phase change layer is in the amorphous state.

Data recorded on the phase change layer may be read by comparing the current measured by applying a read voltage to the phase change layer with a reference current.

The conventional phase change memory devices include a storage node having a phase change layer, (e.g., a germanium-antimony-tellurium (GeSbTe) layer commonly referred to as "GST" layer). A titanium (Ti) layer and a titanium nitride (TiN) layer may be sequentially deposited (or formed) on the phase change layer. The TiN layer is used as a top electrode contact layer. The Ti layer is used as an adhesion layer to increase the adhesive force of the TiN layer.

As a write operation or a read operation is repeated in the conventional memory device, Ti diffuses from the Ti layer to the phase change layer. As such, the composition and resistance of the phase change layer may change such that defects are generated in the conventional memory devices. For example, a set stuck failure and a reset stuck failure may occur as a result of the diffusion of Ti during an endurance test of the conventional memory device.

It may be seen from FIGS. 1 through 3 that Ti diffuses to a phase change layer of a storage node of a conventional memory device.

FIG. 1 illustrates a transmission electron microscopy (TEM) image of the storage node of the conventional phase change memory device after an annealing process at 350° C. for 1 hour.

Referring to FIG. 1, a bottom electrode 2 may be a TiN electrode, a phase change layer 4 may be a GST layer, an adhesion layer 6 may be a Ti layer and a top electrode 8 may be a TiN electrode.

FIG. 2 illustrates a high-angle annular dark-field scanning transmission electron microscopy (HAADF-STEM) image of the annealed storage node of FIG. 1. FIG. 3 is an energy dispersive spectroscopy (EDS) data displaying element profiles along line a-a' of FIG. 2.

Referring to FIG. 3, Ti diffuses into the GST layer (i.e., the phase change layer). Te having a higher affinity for Ti moves (or migrates) to the adhesion layer 6.

Sb and Ge move (or migrate) in a direction opposite to that of the Te (i.e., away from the adhesion layer). If the Ti diffuses to the phase change layer, the composition of the phase change layer may change.

SUMMARY

Example embodiments relate to a storage node including a diffusion barrier layer, a phase change memory device having the same and methods of manufacturing the same. Other example embodiments to storage node that suppresses titanium (Ti) diffusion.

Example embodiments provide a storage node and phase change memory device that suppress impurity diffusion from an upper structure stacked on a phase change layer into the phase change layer in order to prevent (or reduce) deterioration of the phase change layer.

According to example embodiments, there is provided a storage node including a bottom electrode and a top electrode, a phase change layer interposed between the bottom electrode and the top electrode and a titanium-tellurium (Ti—Te) based diffusion barrier layer interposed between the top electrode and the phase change layer.

According to example embodiments, there is provided a phase change memory device including a switching element and a storage node as described above. The storage node may be connected to the switching element.

The Ti—Te based diffusion barrier layer may be a $Ti_xTe_{1-x}$ layer wherein the expression $0<x<0.5$ is satisfied. The Ti—Te based diffusion barrier layer may have a thickness of 1 nm to 20 nm.

An adhesion layer may be formed between the Ti—Te based diffusion barrier layer and the top electrode. The adhesion layer may be a titanium (Ti) layer. The phase change layer may be a chalcogenide material layer. The chalcogenide material layer may be a germanium-antimony-tellurium (GeSbTe) based layer.

According to example embodiment, there is provided a method of forming of the storage node including forming a bottom electrode; forming a phase change layer on the bottom electrode; forming a Ti—Te based diffusion barrier layer on the phase change layer and forming a top electrode on the Ti—Te based diffusion barrier layer.

According to example embodiment, there is provided a method of manufacturing a phase change memory device including forming a switching element and connecting a storage node to the switching element.

The Ti—Te based diffusion barrier layer may be a $Ti_xTe_{1-x}$ layer wherein the expression $0<x<0.5$ is satisfied. The Ti—Te based diffusion barrier layer may have a thickness of 1 nm to 20 nm. The Ti—Te based diffusion barrier layer may be formed by sputtering, chemical vapor deposition, evaporation and atomic layer deposition.

The forming of the top electrode on the Ti—Te based diffusion barrier layer may include forming an adhesion layer on the Ti—Te based diffusion barrier layer and forming a top layer on the adhesion layer. The adhesion layer may be a titanium (Ti) layer.

The phase change layer may be formed of a chalcogenide material. The chalcogenide material may be a GeSbTe based material.

Because Ti diffusion from the upper structure stacked on the phase change layer to the phase change layer may be suppressed, the likelihood of problems involving the phase change memory device occurring due to the Ti diffusion may be reduced, increasing the operational reliability of the phase change memory device.

BRIEF DESCRIPTION OF THE DRAWINGS

Example embodiments will be more clearly understood from the following detailed description taken in conjunction with the accompanying drawings.

FIG. 1 illustrates a transmission electronic microscopy (TEM) image of a storage node of a conventional phase change memory device after an annealing process;

FIG. 2 illustrates a high-angle annular dark-field scanning transmission electron microscopy (HAADF-STEM) image of the annealed storage node of FIG. 1;

FIG. 3 illustrates energy dispersive spectroscopy (EDS) data displaying element profiles along line a-a' of FIG. 2;

FIG. 4 is a diagram illustrating a cross-sectional view of a phase change memory device according to example embodiments;

FIG. 5 is a diagram illustrating a cross-sectional view of a phase change memory device according to example embodiments;

FIG. 6 illustrates a TEM image of a storage node of the phase change memory device of FIG. 4;

FIG. 7 illustrates a HAADF-STEM image of the annealed storage node of FIG. 6;

FIG. 8 illustrates EDS data displaying element profiles along line a-a' of FIG. 7; and FIGS. 9 through 13 are diagrams illustrating cross-sectional views of a method of manufacturing a phase change memory device according to example embodiments.

DETAILED DESCRIPTION OF EXAMPLE EMBODIMENTS

Figure 1:
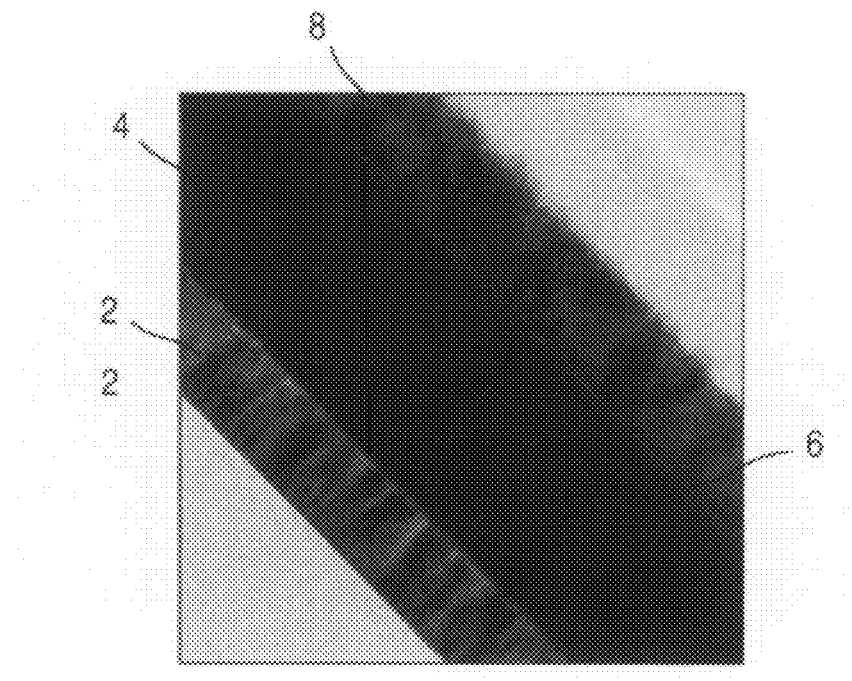
FIGS. 1-13 represent non-limiting, example embodiments as described herein.
Figure 2:
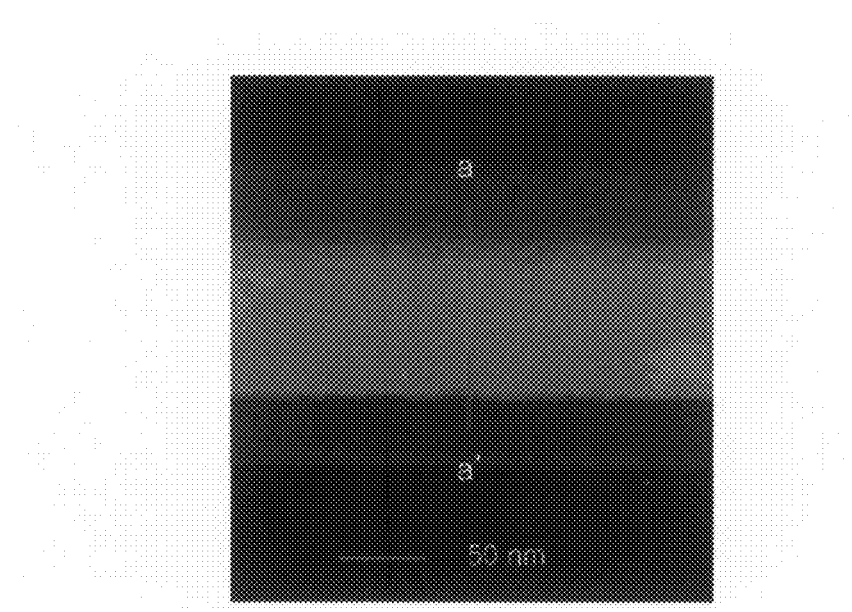
Figure 3:
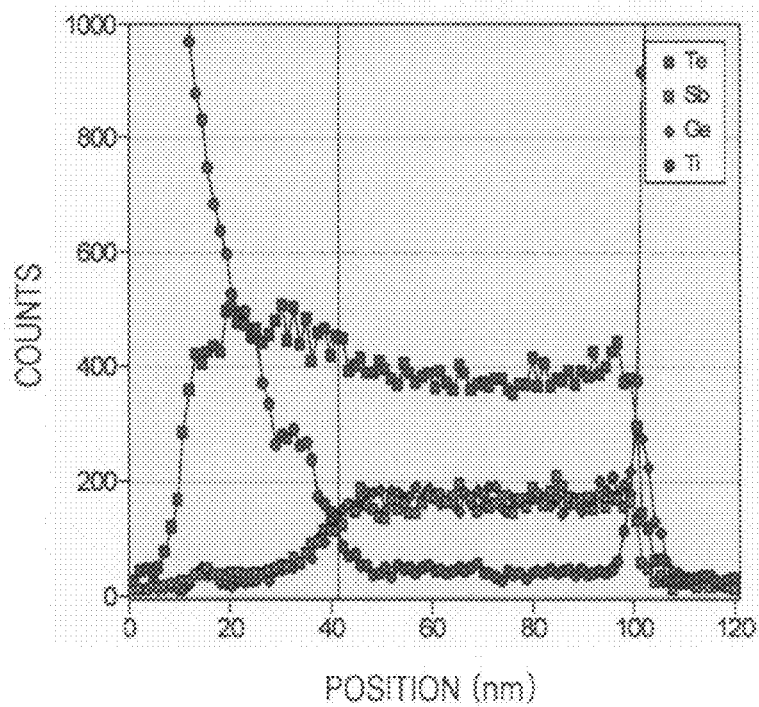

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a storage node including a diffusion barrier layer, a phase change memory device having the same and methods of manufacturing the same. Other example embodiments to storage node that suppresses titanium (Ti) diffusion and a method of manufacturing the phase change memory device.

Figure 4:
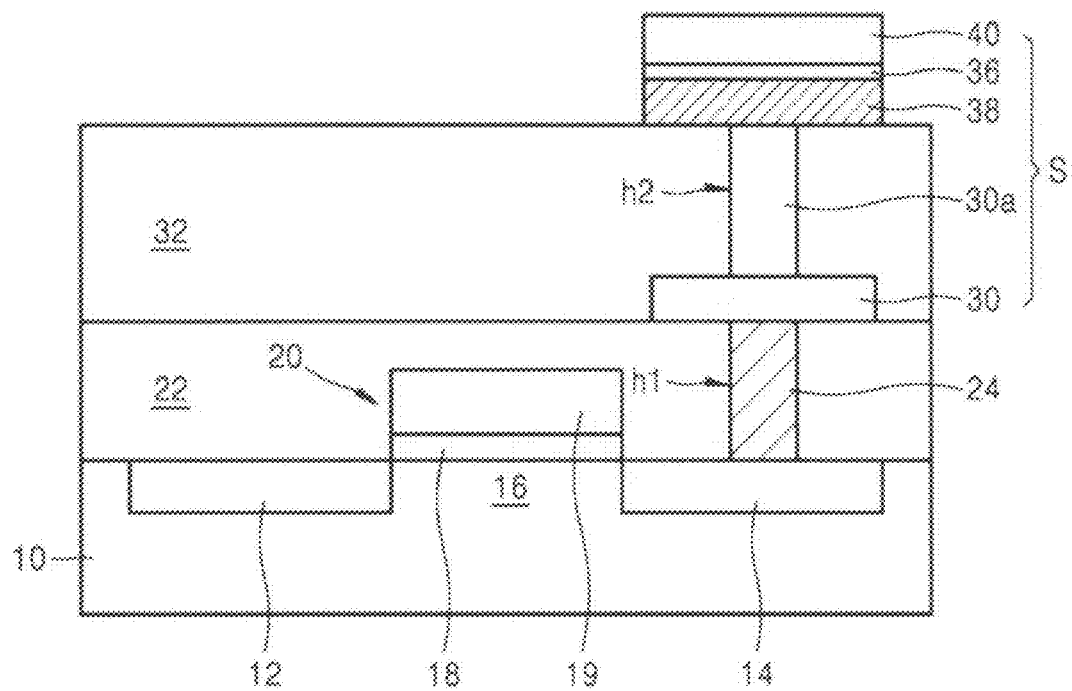

FIG. 4 is a diagram illustrating a cross-sectional view of a phase change memory device according to example embodiments.

Referring to FIG. 4, a first impurity region 12 and a second impurity region 14 may be formed in a substrate 10 spaced apart from each other. The first and second impurity regions 12 and 14 may be formed by doping the substrate 10 with desired conductive impurities (e.g., n-type impurities). One of the first and second impurity regions 12 and 14 may be a source region and the other may be a drain region.

A gate structure 20 may be deposited between the first and second impurity regions 12 and 14 on the substrate 10. A channel region 16 may be disposed (formed) below the gate structure 20. The gate structure 20 includes a gate insulating layer 18 and a gate electrode 19, which are sequentially stacked on the substrate 10. The substrate 10, on which the first and second impurity regions 12 and 14 are formed, and the gate structure 20 form a transistor.

A first insulating interlayer 22 may be formed on the substrate 10 covering the transistor. The first insulating interlayer 22 may be formed of a dielectric material (e.g., silicon oxide ($SiO_x$) or silicon oxynitride ($SiO_xN_y$)). A first contact hole h1 may be formed in the first insulating interlayer 22 exposing the second impurity region 14. The first contact hole h1 may be filled with a conductive plug 24. A bottom electrode 30 may be disposed (or formed) on the first insulating interlayer 22 covering an exposed surface of the conductive plug 24.

A second insulating interlayer 32 may be stacked on the first insulating interlayer 22 covering the bottom electrode 30. A second contact hole h2 may be formed in the second insulating interlayer 32 exposing a part of the bottom electrode 30. The second contact hole h2 may be filled with a bottom electrode contact layer 30a. The bottom electrode contact layer 30a may be formed of a conductive material (e.g., titanium nitride (TiN) or titanium aluminium nitride (TiAlN)). The second insulating interlayer 32 may be formed of the same material as the first insulating interlayer 22.

A phase change layer 38 may be disposed (or formed) on the second insulating interlayer 32 covering an exposed surface of the bottom electrode contact layer 30a. A diffusion barrier layer 36 and a top electrode 40 may be sequentially stacked on the phase change layer 38. The bottom electrode 30, the bottom electrode contact layer 30a, the phase change layer 38, the diffusion barrier layer 36 and the top electrode 40 form a storage node S. The diffusion barrier layer 36 may function as an adhesion layer. The top electrode 40 may be a TiN electrode or a TiAlN electrode.

The phase change layer 38 of the storage node S may be formed of a germanium-antimony-tellurium (GeSbTe, GST) based chalcogenide material. The phase change layer 38 may be formed of one selected from the group consisting of a chalcogenide alloy, a Sb—Te alloy including a 5A group element, a Sb—Se alloy including a 5A group element, a Sb—Te alloy including a 6A group element, a Sb—Se alloy including a 6A group element, a binary phase-change chalcogenide alloy, a quaternary phase-change chalcogenide alloy, a transition metal oxide having a plurality of resistance states and combinations thereof.

The chalcogenide alloy may be one selected from the group consisting of germanium-antimony-tellurium (Ge—Sb—Te), nitrogen-germanium-antimony-tellurium (N—Ge—Sb—Te), arsenic-antimony-tellurium (As—Sb—Te), indium-antimony-tellurium (In—Sb—Te), germanium-bismuth-tellurium (Ge—Bi—Te), tin-antimony-tellurium (Sn—Sb—Te), silver-indium-antimony-tellurium (Ag—In—Sb—Te), gold-indium-antimony-tellurium (Au—In—Sb—Te), germanium-indium-antimony-tellurium (Ge—In—Sb—Te), selenium-antimony-tellurium (Se—Sb—Te), tin-indium-antimony-tellurium (Sn—In—Sb—Te), arsenic-germanium-antimony-tellurium (As—Ge—Sb—Te) and combinations thereof.

The Sb—Te alloy including the 5A group element may be one selected from the group consisting of tantalum-antimony-tellurium (Ta—Sb—Te), niobium-antimony-tellurium (Nb—Sb—Te), vanadium-antimony-tellurium (V—Sb—Te) and combinations thereof.

The 5A group element-Sb—Se alloy may be one selected from the group consisting of tantalum-antimony-selenium (Ta—Sb—Se), niobium-antimony-selenium (Nb—Sb—Se), vanadium-antimony-selenium (V—Sb—Se) and combinations thereof.

The Sb—Te alloy including the 6A group element may be one selected from the group consisting of tungsten-antimony-tellurium (W—Sb—Te), molybdenum-antimony-tellurium (Mo—Sb—Te), chrome-antimony-tellurium (Cr—Sb—Te) and combinations thereof.

The Sb—Se alloy including the 6A group element may be one selected from the group consisting of tungsten-antimony-selenium (W—Sb—Se), molybdenum-antimony-selenium (Mo—Sb—Se), chrome-antimony-selenium (Cr—Sb—Se) and combinations thereof.

The binary phase-change chalcogenide alloy may be at least one selected from the group consisting of Ga—Sb, Ge—Sb, In—Sb, In—Se, Sb—Te, Ge—Te and combinations thereof.

The quaternary phase-change chalcogenide alloy may be at least one selected from the group consisting of Ag—In—Sb—Te, (Ge—Sn)—Sb—Te, Ge—Sb—(Se—Te), Te—Ge—Sb—S and combinations thereof.

The transition metal oxide having the plurality of resistance states may be at least one selected from the group consisting of NiO, TiO$_2$, HfO, Nb$_2$O$_5$, ZnO, WO$_3$, CoO, PCMO(Pr$_x$Ca$_{(1-x)}$MnO$_3$) and combinations thereof.

The diffusion barrier layer 36 of the storage node S may be a titanium-tellurium (Ti—Te)-based material layer. The Ti—Te based material layer may be formed of a material including Ti and Te. The Ti—Te based material may be Ti$_x$Te$_{1-x}$ wherein the expression 0<x<0.5 is satisfied. The Ti—Te based material layer may be formed of Ti$_x$Te$_{1-x}$ wherein the expression 0.2<x<0.4 is satisfied.

Ti has a higher affinity for Te. As such, if both Ti and Te are used to form a thin film, the Ti is bound to the Te preventing the Ti from diffusing into the phase change layer 38.

The diffusion barrier layer 36 may have a thickness of 1 nm to 20 nm. The diffusion barrier layer 36 may have a thickness of 5 nm-15 nm.

Because the diffusion barrier layer 36 is included in the storage node S, Ti diffusion between the phase change layer 38 and the top electrode 40 may be suppressed. A peeling phenomenon between the phase change layer 38 and the top electrode 40 may be avoided (or prevented).

Figure 5:
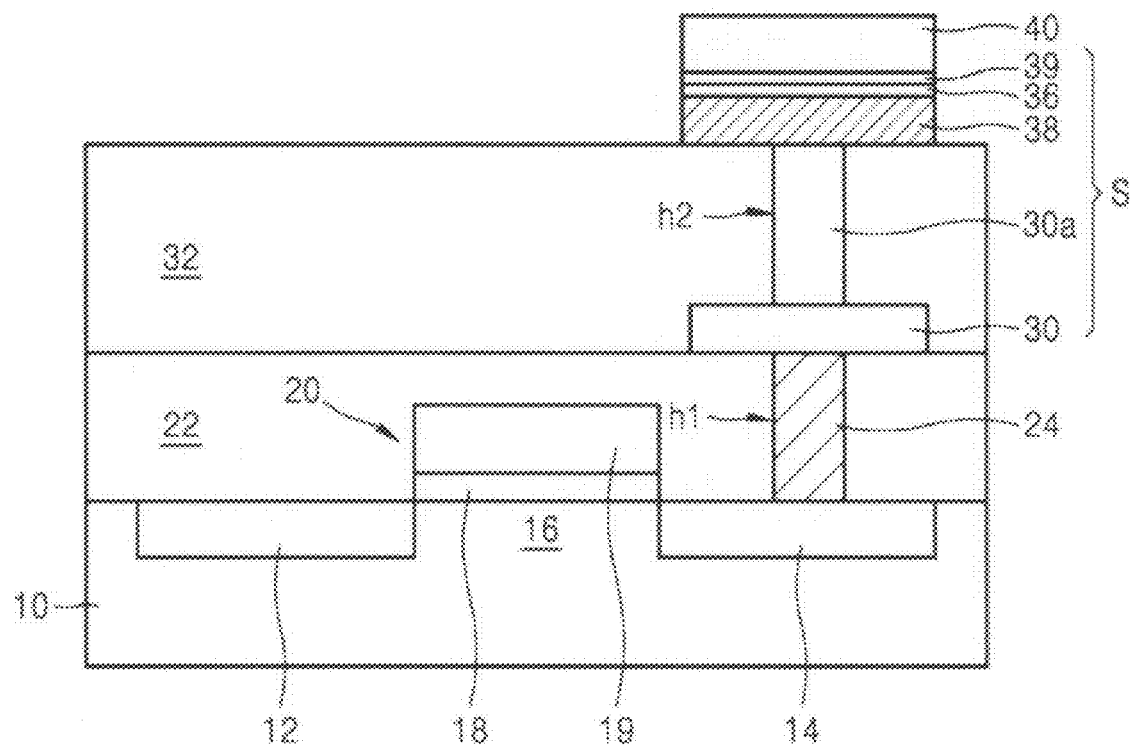

FIG. 5 is a diagram illustrating a cross-sectional view of a phase change memory device according to example embodiments. A description of like elements in FIGS. 4 and 5 will be omitted for the sake of brevity.

Referring to FIG. 5, an adhesion layer 39 may be disposed (or formed) between the phase barrier layer 36 and the top electrode 40. The adhesion layer 39 may be a Ti-based material layer.

The adhesion layer 39 avoids (or reduces) the likelihood of a peeling phenomenon occurring between the phase change layer 38 and the top electrode 40. The diffusion barrier layer 36 suppresses diffusion of Ti from the adhesion layer 39 to the phase change layer 38. The adhesion layer 39 may be a single layer formed of Ti. The adhesion layer 39 may have a thickness of 5 nm to 15 nm.

The following experiment tests the Ti diffusion blocking properties of the diffusion barrier layer included in the storage node S according to example embodiments.

In the experiment, the storage node was formed as described above. The storage node was annealed at 350° C. for 1 hour. The annealed storage node was tested to determine whether Ti diffused using a transmission electronic microscopy (TEM), a high-angle annular dark-field scanning transmission electron microscopy (HAADF-STEM) or the like.

The bottom electrode contact layer of the storage node was formed of TiN. The phase change layer was a GST layer. The diffusion barrier layer 36 was a Ti—Te layer. The top electrode 40 was a Ti electrode.

Figure 6:
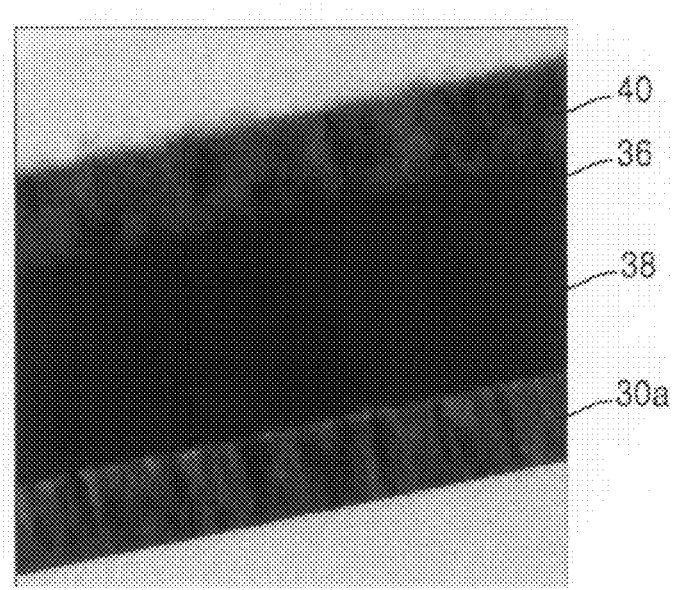
Figure 7:
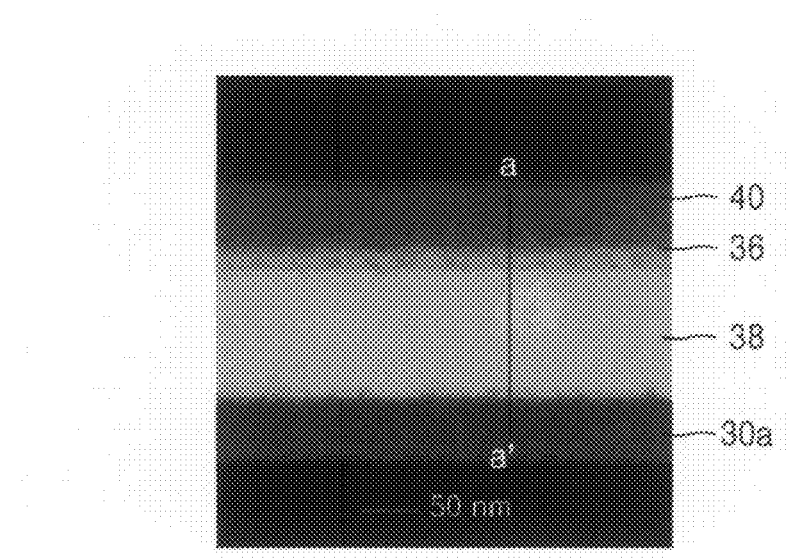
Figure 8:
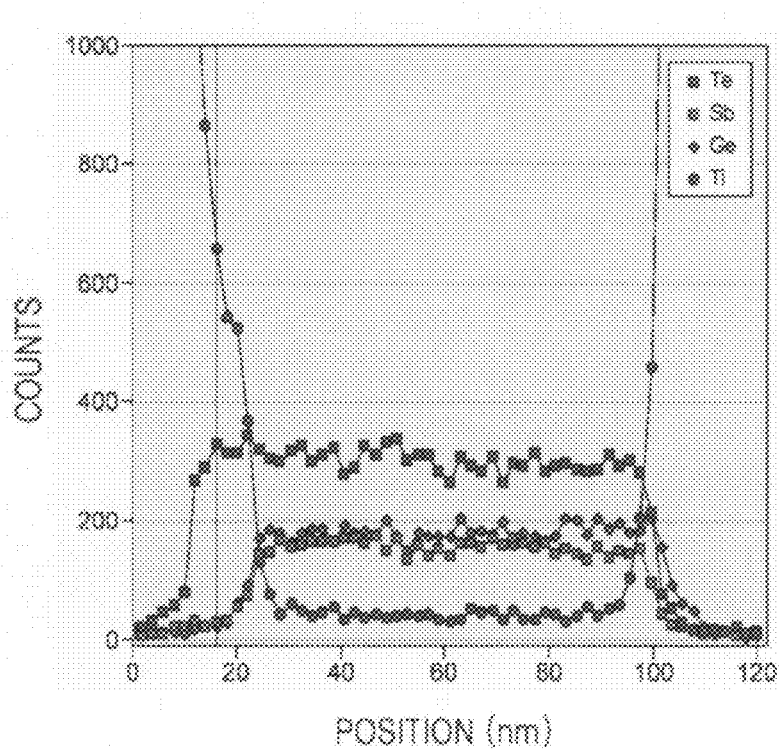

FIG. 6 illustrates a TEM image of the storage node used in the above experiment. FIG. 7 illustrates a HMDF-STEM image of the annealed storage node. FIG. 8 illustrates EDS data displaying element profiles along line a-a' of FIG. 7.

Referring to FIG. 8, if the Ti is compared with Ge, Sb and Te (the elements forming the phase change layer 38), diffusion of Ti into the GST layer (the phase change layer 38) was not observed.

FIGS. 9 through 13 are diagrams illustrating cross-sectional views of a method of manufacturing a phase change memory device according to example embodiments.

Material layers described in example embodiments may be formed by vapor deposition methods well-known in the manufacture of semiconductor memory devices (e.g., sputtering, metal organic chemical vapor deposition (MOCVD), evaporation including chemical vapor deposition (CVD) and physical vapor deposition (PVD)). A detailed explanation thereof will not be given for the sake of brevity.

Figure 9:
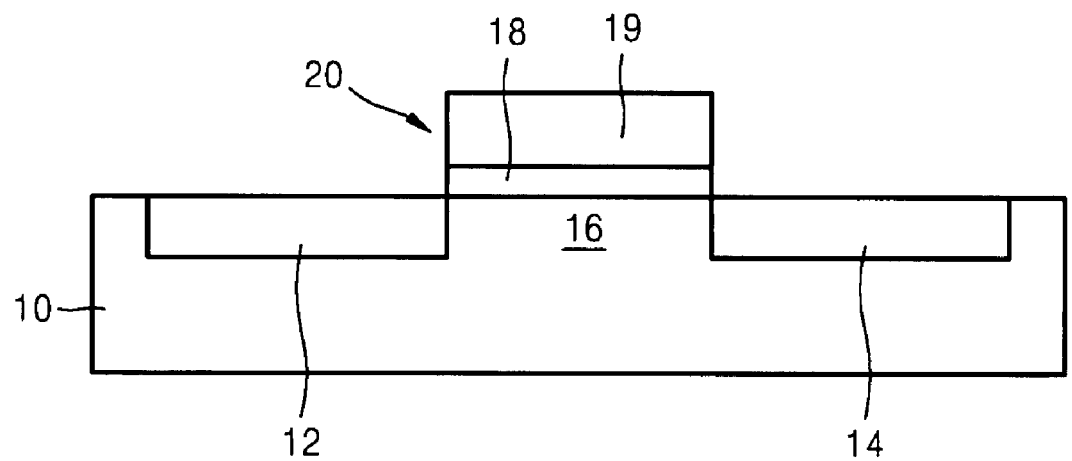

Referring to FIG. 9, a gate structure 20 may be formed on a desired region of a substrate 10. The gate structure 20 may be formed by sequentially stacking a gate insulating layer 18 and a gate electrode 19. Conductive impurities may be ion-implanted into the substrate 10 using the gate structure 20 as a mask. The conductive impurities may be n-type impurities. As a result of the implantation of the conductive impurities, first and second impurity regions 12 and 14 may be formed in the substrate 10 with the gate structure 20 therebetween. One of the first and second impurity regions 12 and 14 may be used as a source region and the other may be used as a drain region. The gate structure 20, the first and second impurity regions 12 and 14 and the substrate 10 form a transistor, which is a switching element. A region, which is directly under the gate insulating layer 18 of the substrate 10 between the first and second impurity regions 12 and 14, may become a channel region 16.

Figure 10:
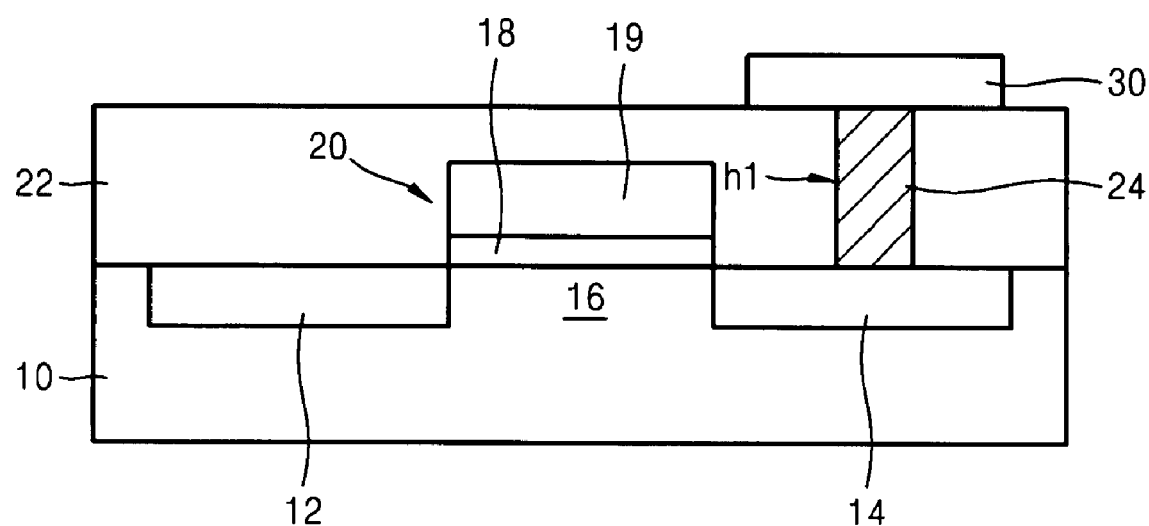

Referring to FIG. 10, a first insulating interlayer 22 may be formed on the substrate 10 covering the transistor. The first insulating interlayer 22 may be formed of a dielectric material (e.g., SiO$_x$ or SiO$_x$N$_y$). A first contact hole h1 may be formed in the first insulating interlayer 22 to expose the second impurity region 14. A conductive plug 24 may be formed by filling the first contact hole h1 with a conductive material. A bottom electrode 30 may be formed on the first insulating interlayer 22 covering an exposed surface of the conductive plug 24. The bottom electrode 30 may be formed of TiN or TiAlN. The bottom electrode 30 may be formed of a silicide containing one selected from the group consisting of Ag, Au, Al, Cu, Cr, Co, Ni, Ti, Sb, V, Mo, Ta, Nb, Ru, W, Pt, Pd, Zn, Mg and combinations thereof. The bottom electrode 30 may be formed by CVD, ALD or annealing using metal-ion implantation, but is not limited thereto.

Figure 11:
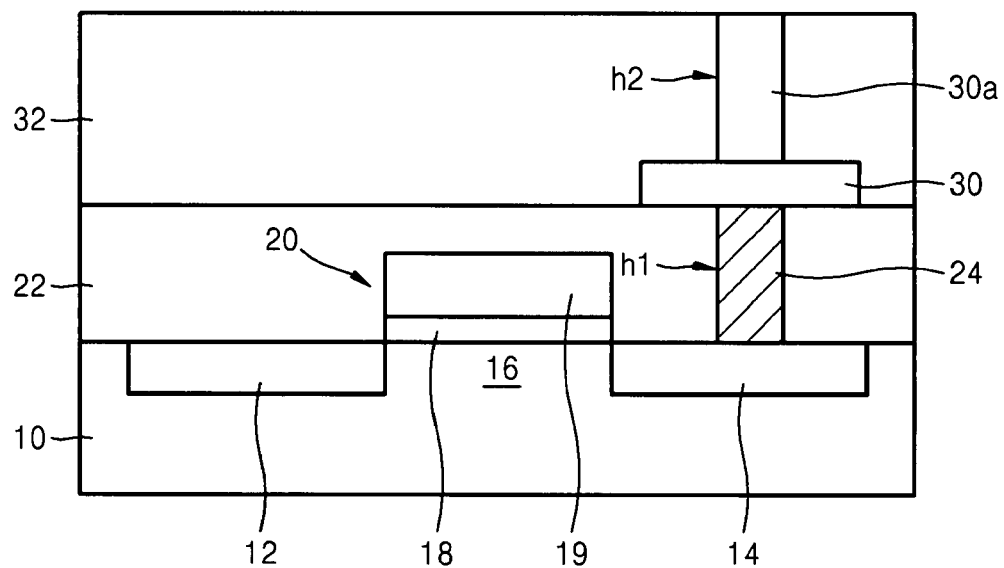

Referring to FIG. 11, a second insulating interlayer 32 may be formed on the first insulating interlayer 22 covering the bottom electrode 30. The second insulating interlayer 32 may be formed of a dielectric material (e.g., SiO$_x$ or SiO$_x$N$_y$). A second contact hole h2 may be formed in the second insulating interlayer 32 exposing a portion of a top surface of the bottom electrode 30. A bottom electrode contact layer 30a may be formed by filling the second contact hole h2 with TiN or TiAlN. The bottom electrode contact layer 30a may be a resistive heater. The width of a top surface of the bottom electrode contact layer 30a may be less than the width of the top surface of the bottom electrode 30.

Figure 12:
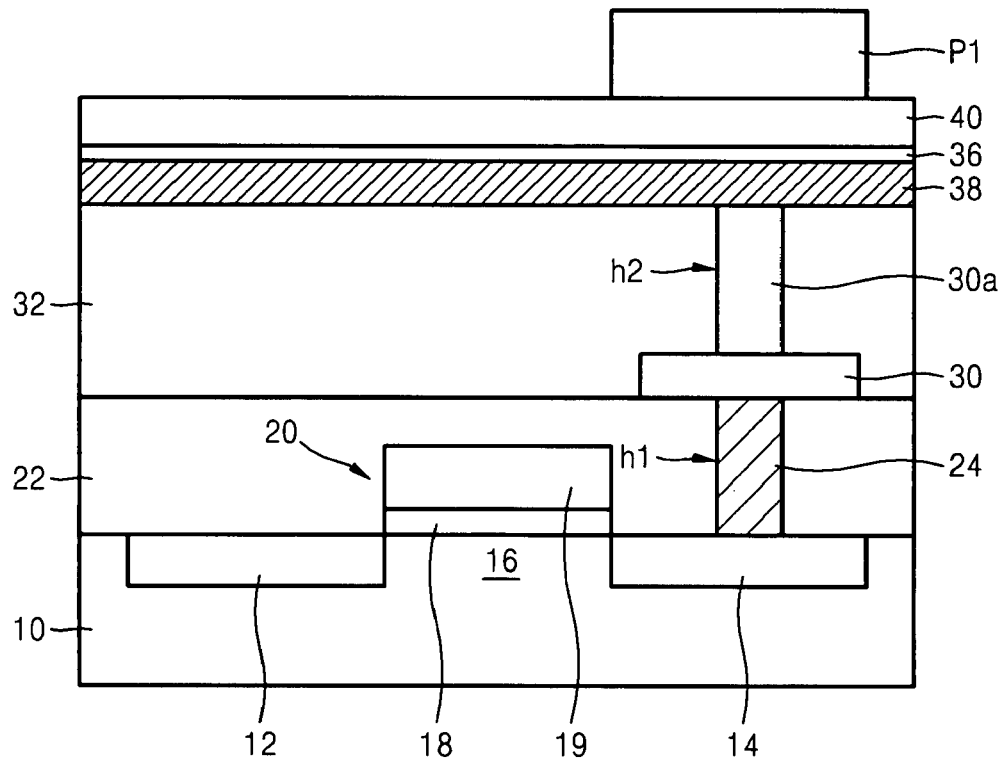

Referring to FIG. 12, a phase change layer 38, a diffusion barrier layer 36, and a top electrode 40 may be sequentially stacked on the second insulating interlayer 32 covering the top surface of the bottom electrode contact layer 30a. The diffusion barrier layer 36 may function as an adhesion layer. The phase change layer 38, the diffusion barrier layer 36 and the top electrode 40 may be respectively formed of the same materials as those described in FIG. 4. The diffusion barrier layer 36 may have the same thickness as that described in FIG. 4. The diffusion barrier layer 36 may be formed by vapor deposition (e.g., sputtering, MOCVD or evaporation). The top electrode 40 may be formed by CVD, ALD, sputtering or evaporation.

If the diffusion barrier layer 36 is formed by sputtering, a sputtering power for a Te target may be set to 30 W and a sputtering power for a Ti target may range from 30 W to 100 W in order to change (or control) the composition of the diffusion barrier layer 36. If the sputtering power applied to the Ti target may be controlled in a range from 50 W to 80 W. An optimal power level may be determined by the size of the target. During the sputtering, the deposition temperature of the diffusion barrier layer 36 may range from 150° C. to 350°

C. The deposition temperature of the diffusion barrier layer 36 may be 200° C. or about 200° C.

Figure 13:
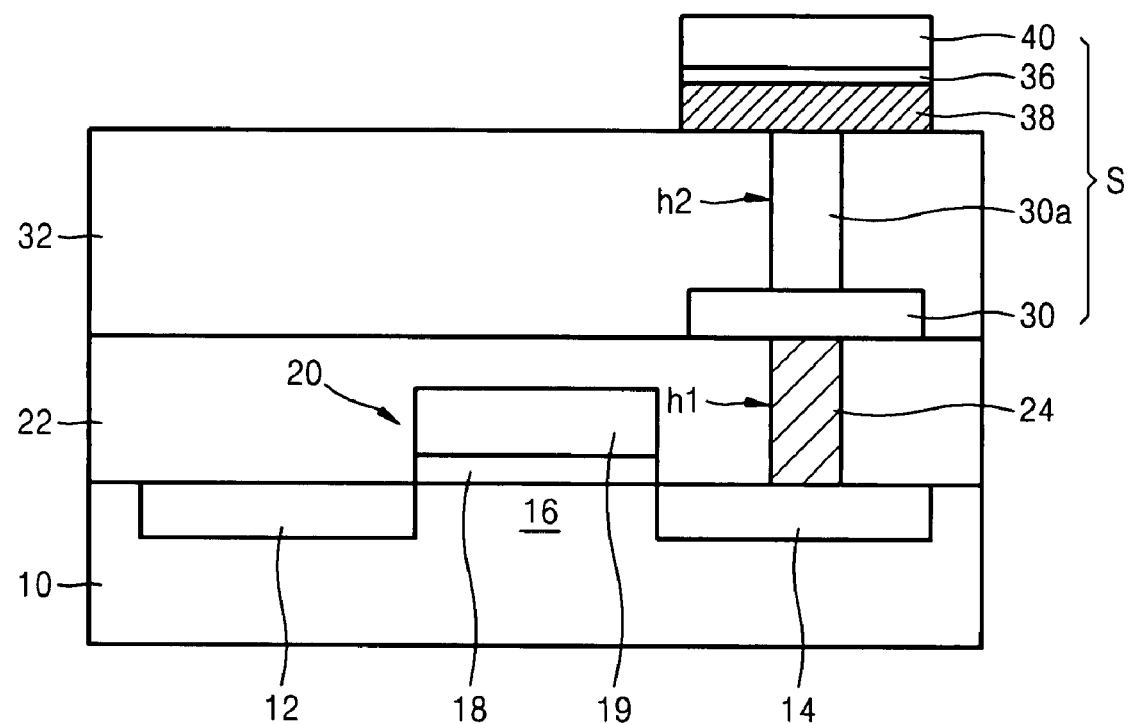

After the top electrode 40 is formed, a photosensitive layer pattern P1 may be formed on the top electrode 40 establishing a region where a storage node S (see FIG. 4) will be formed. The top electrode 40, the diffusion barrier layer 36 and the phase change layer 38 may be sequentially etched using the photosensitive layer pattern P1 as an etching mask. The photosensitive layer pattern P1 may be removed, forming the storage node S including the bottom electrode 30, the bottom electrode contact layer 30a, the phase change layer 38, the diffusion barrier layer 36 and the top electrode 40 as shown in FIG. 13.

A material layer may be added to the storage node S. For example, a Ti-based adhesion layer may be formed between the diffusion barrier layer 36 and the top electrode 40. The storage node S may be formed such that the diffusion barrier layer 36, the Ti-based adhesion layer and the top electrode 40 are stacked. The adhesive force between the phase change layer 38 and the top electrode 40 may increase. The adhesion layer may be omitted.

As described above, the phase change memory device according to example embodiments includes the diffusion barrier layer disposed (or formed) on the top surface of the phase change layer. Impurities (e.g., Ti), which might degrade the properties of the phase change layer, may be suppressed from diffusing from the upper structure (i.e., the top electrode and/or the Ti-based adhesion layer) stacked on the phase change layer. The phase change memory device may avoid (or reduce) defects that are generated due to the degradation of the phase change layer resulting from the diffusion of the Ti to the phase change layer (e.g., a set stuck failure and/or a reset stuck failure occurred during an endurance test). The reliability of the phase change memory device according to example embodiments may increase.

While example embodiments have been particularly shown and described, it will be understood by those of ordinary skill in the art that example embodiments are merely examples and should not be construed as limiting the scope of the present application. For example, as long as the diffusion barrier layer 36 is included in the storage node S, the storage node S may be modified into various structures. Without passing through the bottom electrode 30 and the conductive plug 24, the bottom electrode contact layer 30a may directly contact the transistor. Accordingly, the spirit and scope of example embodiments is defined by the following claims.

What is claimed is:

1. A storage node, comprising:
   a bottom electrode and a top electrode;
   a phase change layer interposed between the bottom electrode and the top electrode; and
   a titanium-tellurium (Ti—Te) based diffusion barrier layer interposed between the top electrode and the phase change layer.

2. The storage node of claim 1, wherein the Ti—Te based diffusion barrier layer is a $Ti_xTe_{1-x}$ layer wherein the expression $0<x<0.5$ is satisfied.

3. The storage node of claim 2, wherein the expression $0.2<x<0.4$ is satisfied.

4. The storage node of claim 2, wherein the Ti—Te based diffusion barrier layer has a thickness of 1 nm to 20 nm.

5. The storage node of claim 1, further comprising an adhesion layer between the Ti—Te based diffusion barrier layer and the top electrode.

6. The storage node of claim 5, wherein the adhesion layer is a Ti layer.

7. The storage node of claim 1, wherein the phase change layer is a chalcogenide material layer.

8. The storage node of claim 7, wherein the chalcogenide material layer is a germanium-antimony-tellurium (GeSbTe) based layer.

9. A phase change memory device, comprising:
   a switching element; and
   a storage node according to claim 1, wherein the storage node is connected to the switching element.

10. A method of forming a storage node, comprising:
    forming a bottom electrode;
    forming a phase change layer on the bottom electrode;
    forming a Ti—Te based diffusion barrier layer on the phase change layer; and
    forming a top electrode on the Ti—Te based diffusion barrier layer.

11. The method of claim 10, wherein the Ti—Te based diffusion barrier layer is a $Ti_xTe_{1-x}$ layer wherein the expression $0<x<0.5$ is satisfied.

12. The method of claim 11, wherein the expression $0.2<x<0.4$ is satisfied.

13. The method of claim 10, wherein the Ti—Te based diffusion barrier layer has a thickness of 1 nm to 20 nm.

14. The method of claim 10, wherein the Ti—Te based diffusion barrier layer is formed by a method selected from the group consisting of sputtering, chemical vapor deposition, evaporation and atomic layer deposition.

15. The method of claim 10, wherein the forming of the top electrode includes:
    forming an adhesion layer on the Ti—Te based diffusion barrier layer; and
    forming a top layer on the adhesion layer.

16. The method of claim 15, wherein the adhesion layer is a titanium (Ti) layer.

17. The method of claim 10, wherein the phase change layer is formed of a chalcogenide material.

18. The method of claim 17, wherein the chalcogenide material is a GeSbTe-based material.

19. A method of manufacturing a phase change memory device, comprising:
    forming a switching element; and
    connecting the storage node according to claim 10 to the switching element.

* * * * *